(12) United States Patent
Sagues et al.

(10) Patent No.: US 6,323,616 B1
(45) Date of Patent: Nov. 27, 2001

(54) SELF TEACHING ROBOTIC WAFER HANDLING SYSTEM

(75) Inventors: Paul Sagues, Ross; Robert T. Wiggers, San Francisco; Sanjay K. Aggarwal, Berkeley; Kevin D. D'Souza; Nathan H. Harding, both of San Francisco, all of CA (US)

(73) Assignee: Berkeley Process Control, Inc., Richmond, CA (US)

( * ) Notice: Subject to any disclaimer, the term of this patent is extended or adjusted under 35 U.S.C. 154(b) by 0 days.

(21) Appl. No.: 09/564,300

(22) Filed: May 3, 2000

Related U.S. Application Data

(63) Continuation-in-part of application No. 09/270,261, filed on Mar. 15, 1999, now Pat. No. 6,075,334, and a continuation-in-part of application No. 09/524,025, filed on Mar. 13, 2000.

(51) Int. Cl.$^7$ ........................................... B25J 9/18
(52) U.S. Cl. ................. 318/568.11; 318/568.15; 318/568.16; 318/568.21; 318/570; 318/574
(58) Field of Search .......................... 318/568.11, 568.15, 318/568.16, 568.21, 570; 414/744.6, 416; 901/47, 640

(56) References Cited

U.S. PATENT DOCUMENTS

| | | | |
|---|---|---|---|
| 5,740,062 | * | 4/1998 | Berken et al. .................. 318/640 |
| 5,789,890 | * | 8/1998 | Genov et al. ................... 318/567 |

\* cited by examiner

*Primary Examiner*—Karen Masih
(74) *Attorney, Agent, or Firm*—Pillsbury Winthrop LLP; David H. Jaffer

(57) ABSTRACT

A wafer handling apparatus having input and output robotic systems directed by a programmed controller. Each system has components including a robot, a twist and rotate, and a carrier and automated carrier rail. The input system is for removing wafers from their wafer pod, placing them in the carrier and transporting them via the rail to a wafer processing area. The output system performs the reverse operation, taking wafers from a carrier following processing and placing them in a pod. Each robot includes a plurality of interconnected, articulated cantilevered arms. The last one of the arms has a wand on one end and a laser emitter detector on the other end, and operates in cooperation with the controller to provide location detection of system components. The controller also includes circuitry for sensing contact of the wand with an object by measuring the increased robot motor torque occurring upon contact. The controller is pre-programmed with approximate physical dimensions of the system components and their relative positions. The controller is additionally programmed to automatically perform a precision calibration/teaching routine to gather more precise location data. The process of precision teaching/calibration begins by placing a pod calibration fixture on a pedestal. The controller then directs the input robot to sense the fixture position, which gives the controller precise data relating to the position of a pod on the pedestal. The robot then senses the position of the twist and rotate components. The process begins by sensing the height of two arms of the twist and rotate, and the controller adjusts the arm heights until they are level. The controller then directs the robot to sense the R and θ dimensions of the twist and rotate, and these precise dimensions are saved in the controller.

16 Claims, 12 Drawing Sheets

SELF TEACHING ROBOTIC WAFER HANDLING SYSTEM

The present application is a continuation-in-part of U.S. patent applications Ser. No. 09/270,261 filed Mar. 15, 1999 now U.S. Pat. No. 6,075,334, and 09/524,025 filed Mar. 13, 2000.

BACKGROUND OF THE INVENTION

1. Field of the Invention

The present invention relates to wafer handling systems and more particularly to an apparatus for transferring wafers into and out of processing, wherein the apparatus automatically calibrates the necessary positions of its related parts.

2. Description of the Prior Art

In fabricating semiconductors, silicon wafers are often held in a cassette and then moved to various pre-programmed processing locations by a robotic handling system. The latter typically includes a mechanism with degrees of freedom in radial (R), angular (θ) and vertical (Z) directions and has a robot arm with a vacuum or edge-gripping wand. The robot must be able to pick up wafers from a storage cassette and then transfer them to a designated station or a plurality of stations where the wafer will undergo a process such as heating or alignment. In order to perform these actions, the robot must have precise knowledge of the R, θ and Z positions of where the wafer is to be placed at all cassette and station locations. A robot control system must include the knowledge required for positioning the robot arm with gripped wafer precisely within a cassette or process station for each robot function.

In a typical wafer handling layout the general geometry of both the robot and the various process stations such as the cassette stand are known, and the dimensional relationships between the robot and each station are known within nominal tolerances (e.g.=0.10 inches), available from CAD drawings or manual measurements. When in use, however, the robot must be controlled to move wafers more precisely in order to assure that the robot system operates properly without damaging any system component or the wafer being handled.

In order to assure the close tolerances required for the necessary precision, the controller of the robotic element must be reprogrammed or "re-taught" new location data whenever a component is changed, or upon initial setup or when restarted. The term "teach" or "teaching" will be used to describe the process of gathering and entering component/structural location data into the system controller. Due to the need to minimize contaminants in the semiconductor processing environment, most robotic systems are installed in enclosures for control of the atmosphere. In prior art systems, it is generally necessary for a technician to enter the enclosure to position the robot while performing the teaching/calibration operations. These entries can contaminate the clean enclosure. In addition, the cramped, confined enclosure with moving robot parts presents a significant safety problem for the technician. This manual and awkward process is also time consuming and costly, and an inherently subjective process that relies upon the judgment and skill of the technician.

For example, using conventional controls, a robot is installed and taught by jogging the robot around and, at each process station, the wafer placement locations are recorded with a teach pendant. Besides consuming many hours, this manual procedure introduces subjectivity and thus a significant possibility for errors. This creates a problem of reproducibility. Whenever a wafer cassette is not perfectly positioned within specification or a machine component wears, settles or malfunctions and requires replacement, the robot must be re-taught because it cannot automatically adapt to such variations. If the robot is not re-taught properly within close tolerances, serious damage or loss of expensive wafers can result.

It is clear from the above description of the prior art that an improved system for handling wafers is needed to eliminate the requirement of an operator entering the wafer handling enclosure environment for calibration/teaching operations.

SUMMARY

It is therefore an object of the present invention to provide a wafer handling system that avoids the need for an operator to enter the robotic enclosure for teaching/calibration of the system.

It is a further object of the present invention to provide a wafer handling system that is capable of self calibration.

It is a still further object of the present invention to provide a wafer handling system that eliminates enclosure contamination from operator intervention during system teaching operations.

It is another object of the present invention to provide a wafer handling system that minimizes the time required for system teaching.

Briefly, a preferred embodiment of the present invention includes a wafer handling apparatus having input and output robotic systems directed by a programmed controller. Each system has components including a robot, a twist and rotate, and a carrier and automated carrier rail. The input system is for removing wafers from their wafer pod, placing them in the carrier and transporting them via the rail to a wafer processing area. The output system performs the reverse operation, taking wafers from a carrier following processing and placing them in a pod. Each robot includes a plurality of interconnected, articulated cantilevered arms. The last one of the arms has a wand on one end and a laser emitter detector on the other end, and operates in cooperation with the controller to provide location detection of system components. The controller also includes circuitry for sensing contact of the wand with an object by measuring the increased robot motor torque occurring upon contact. The controller is pre-programmed with approximate physical dimensions of the system components and their relative positions. The controller is additionally programmed to automatically perform a precision calibration/teaching routine to gather more precise location data. The process of precision teaching/calibration begins by placing a pod calibration fixture on a pedestal. The controller then directs the input robot to sense the fixture position, which gives the controller precise data relating to the position of a pod on the pedestal. The robot then senses the position of the twist and rotate components. The process begins by sensing the height of two arms of the twist and rotate, and the controller adjusts the arm heights until they are level. The controller then directs the robot to sense the R and θ dimensions of the twist and rotate, and these precise dimensions are saved in the controller.

IN THE DRAWING

Figure 6:
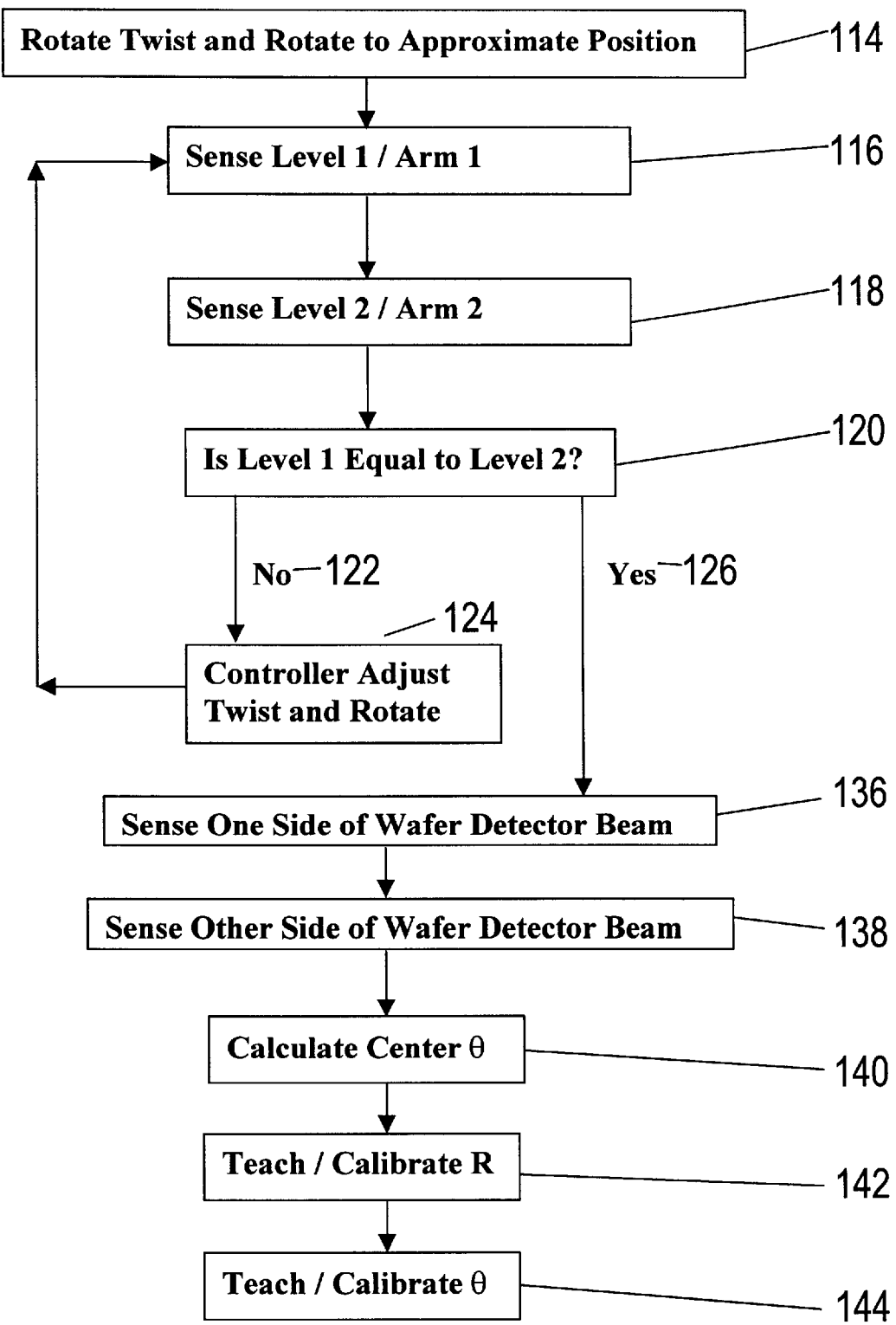
Figure 7:
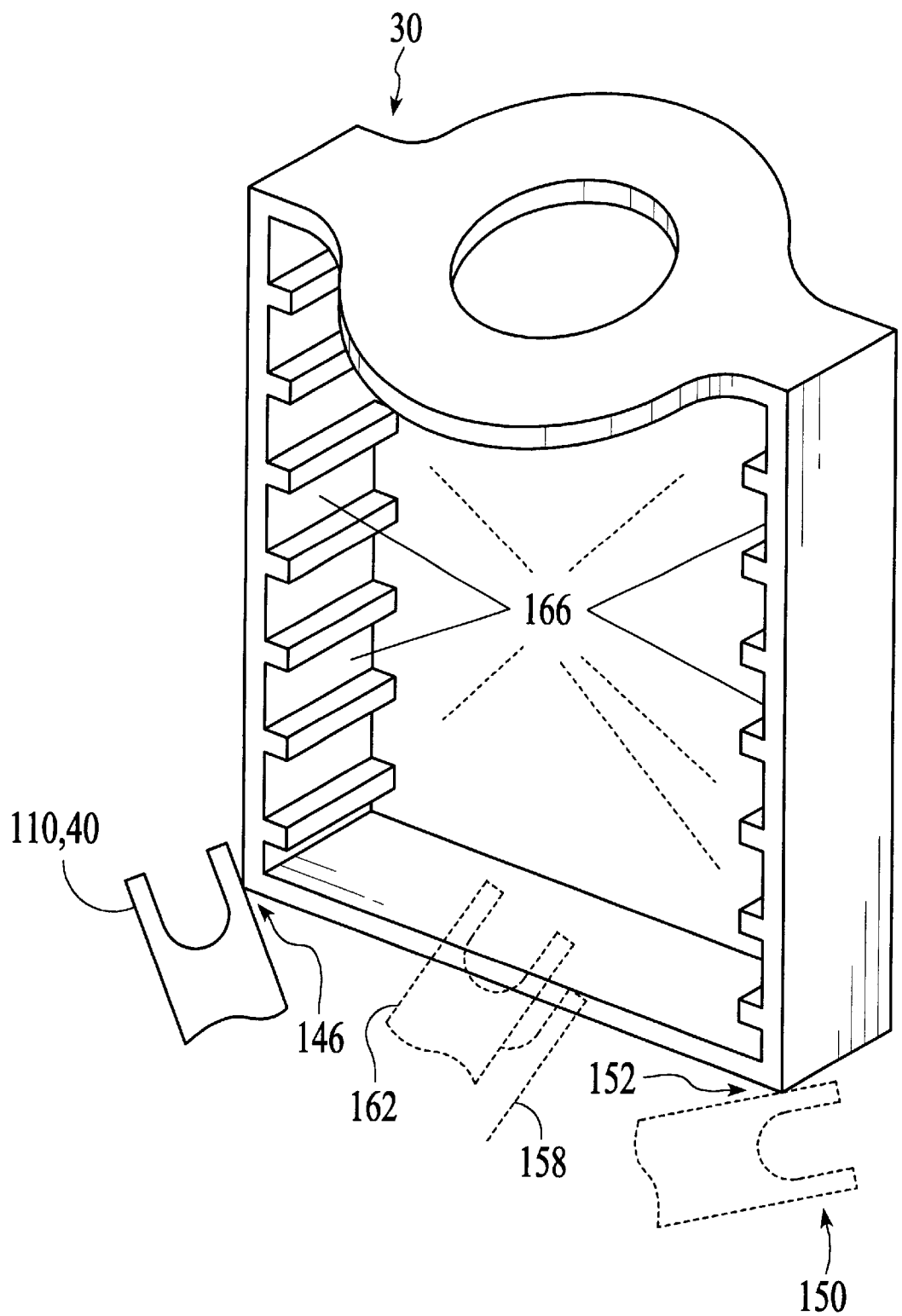
Figure 8:
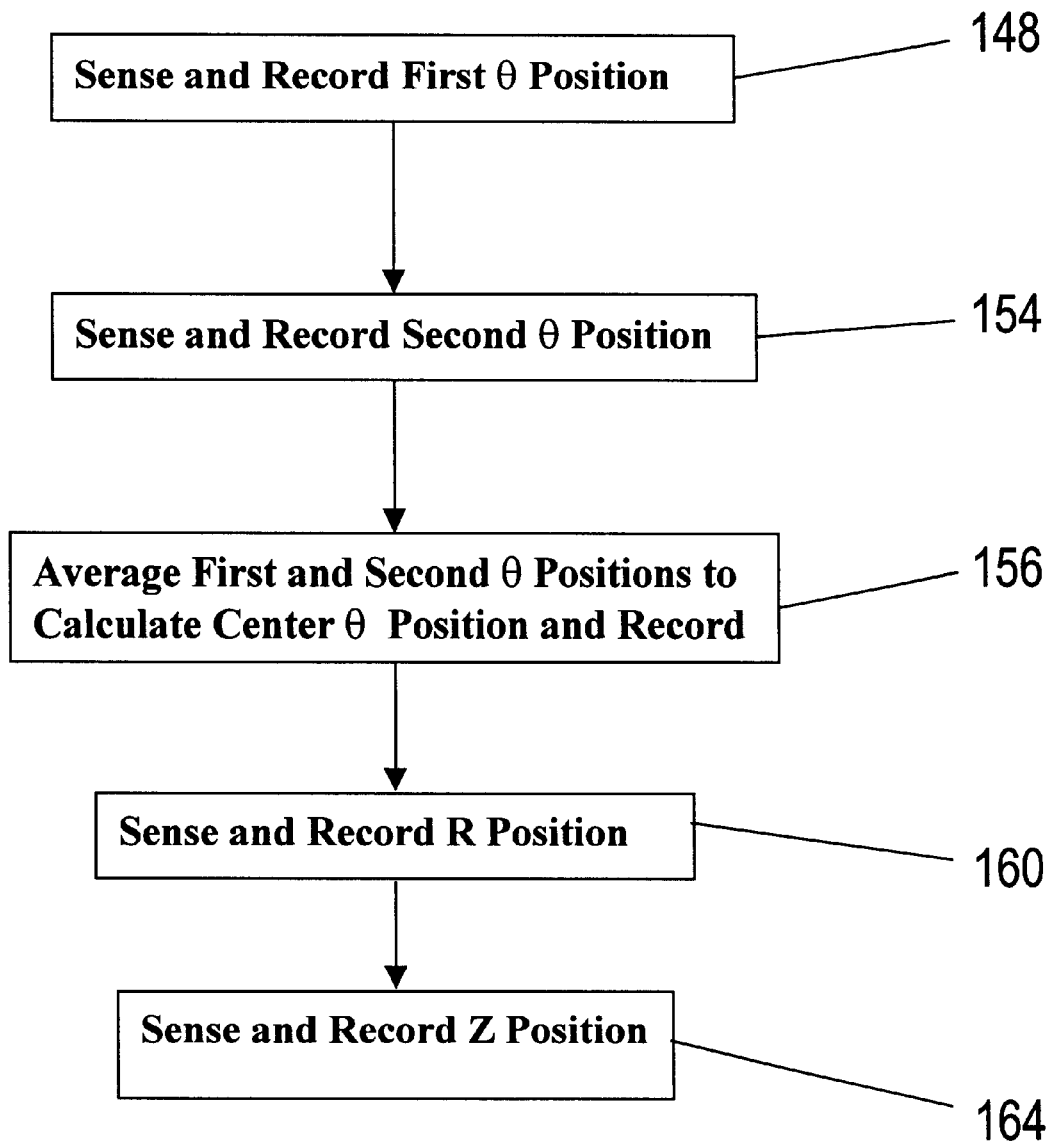
Figure 9:
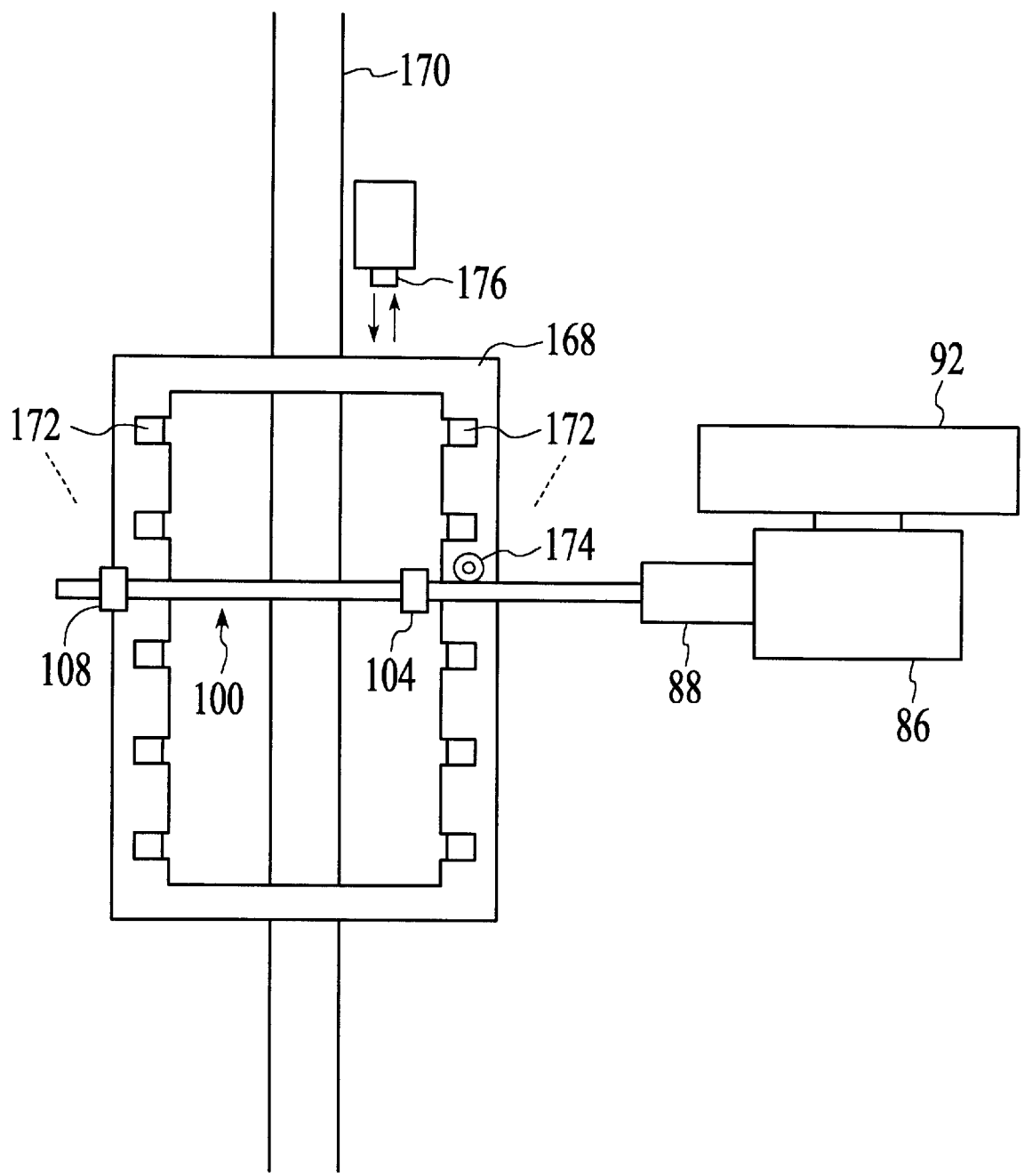
Figure 10:
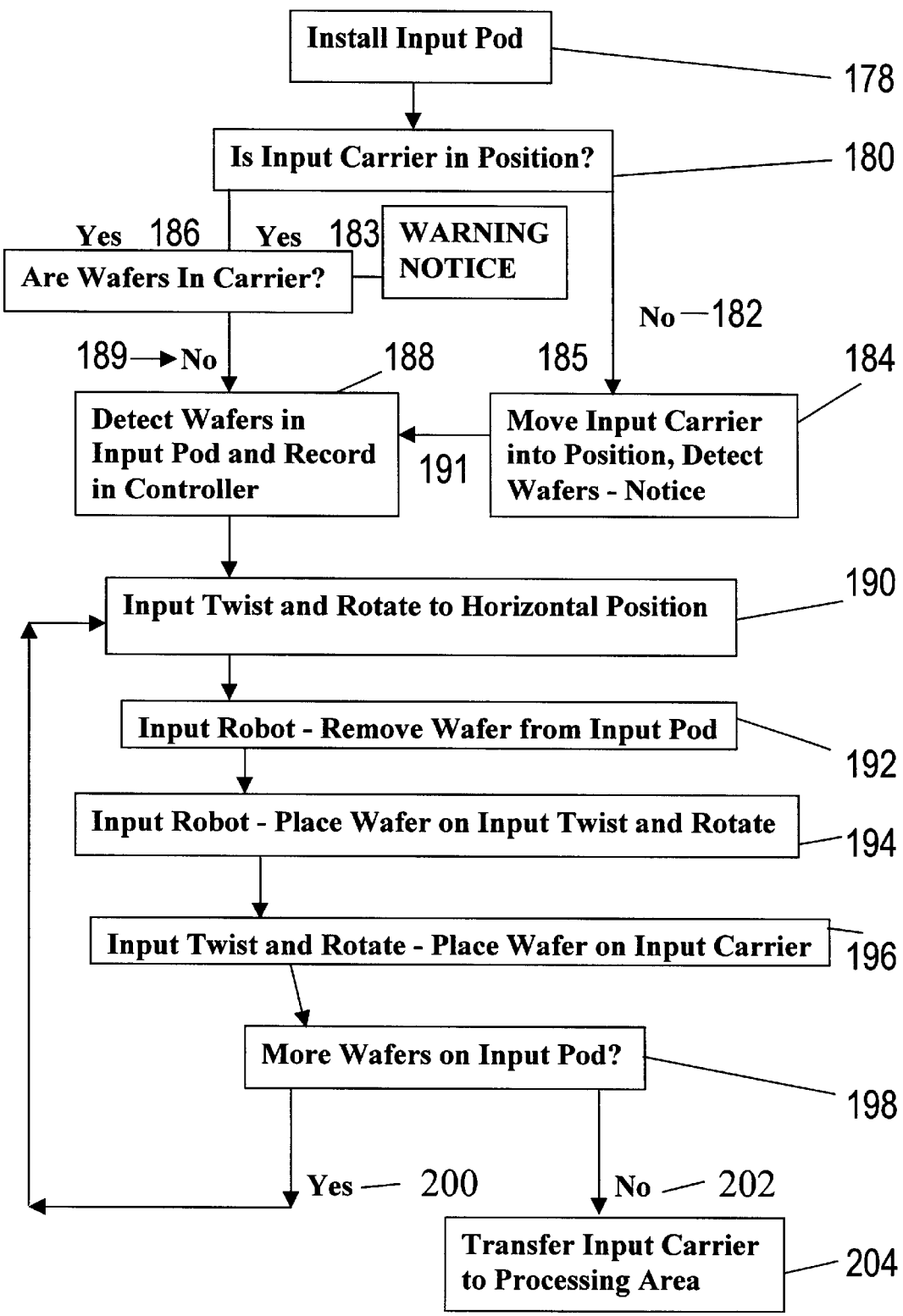
Figure 11:
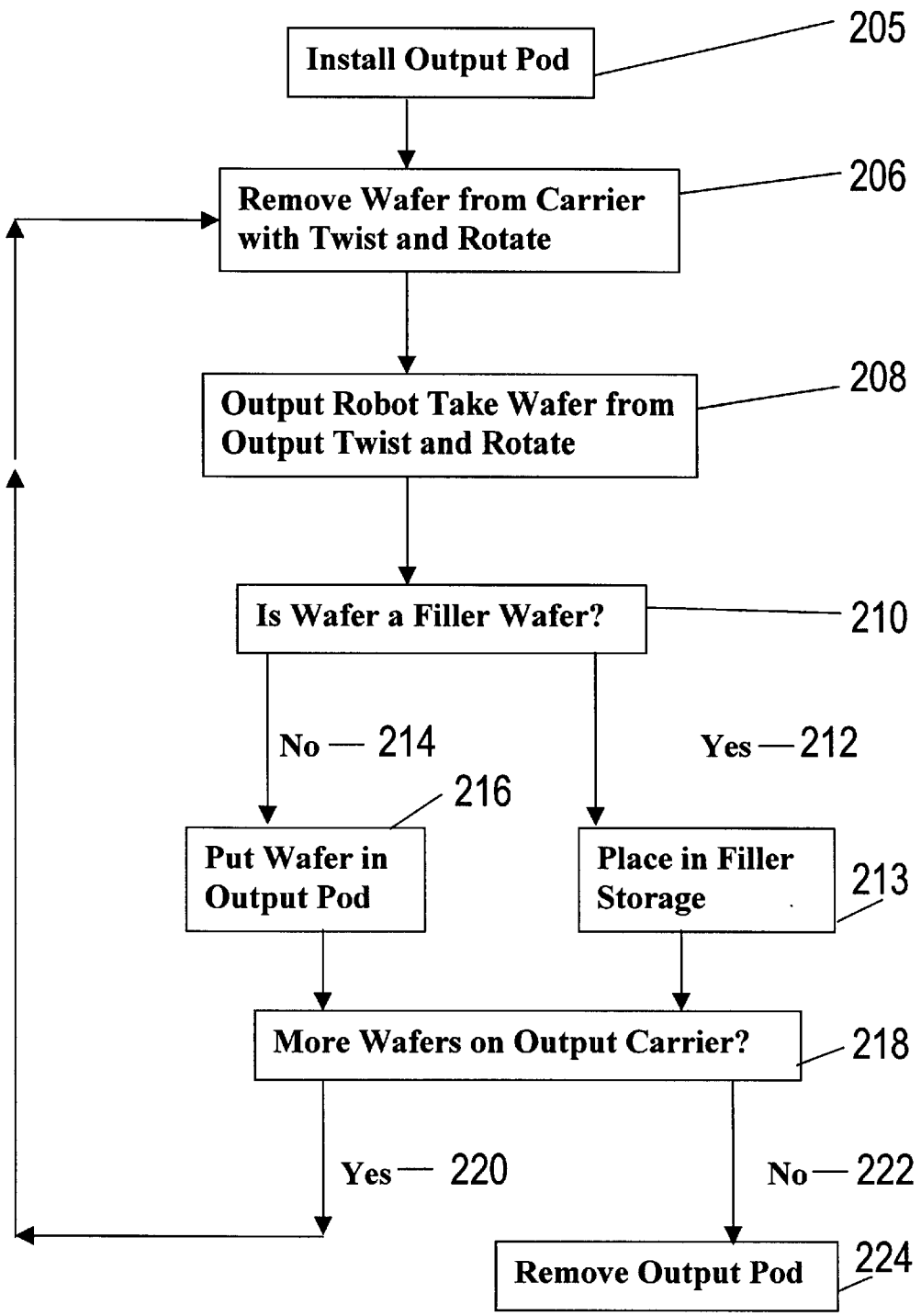

FIG. 6 details the procedures required to level the twist and rotate and acquire twist and rotate location data;

FIG. 7 is a perspective view for illustrating calibration of a filler storage;

FIG. 8 is a flow chart of the procedure of gathering the location data for the filler storage;

FIG. 9 is an illustration for describing a procedure for teaching the twist and rotate to carrier data;

FIG. 10 is a flow chart of the wafer loading operation;

FIG. 11 is a flow chart of the wafer unloading operation; and

Figure 12:
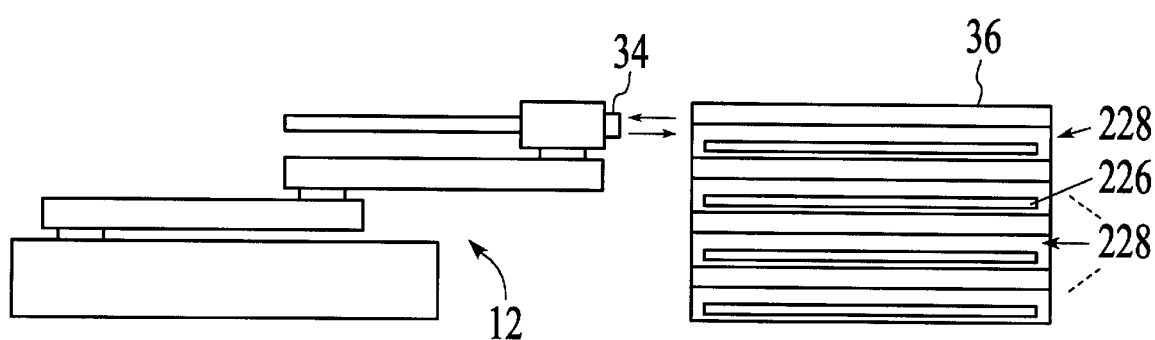

FIG. 12 illustrates the robot sensing wafers in a pod.

DETAILED DESCRIPTION OF THE PREFERRED EMBODIMENT

Figure 1:
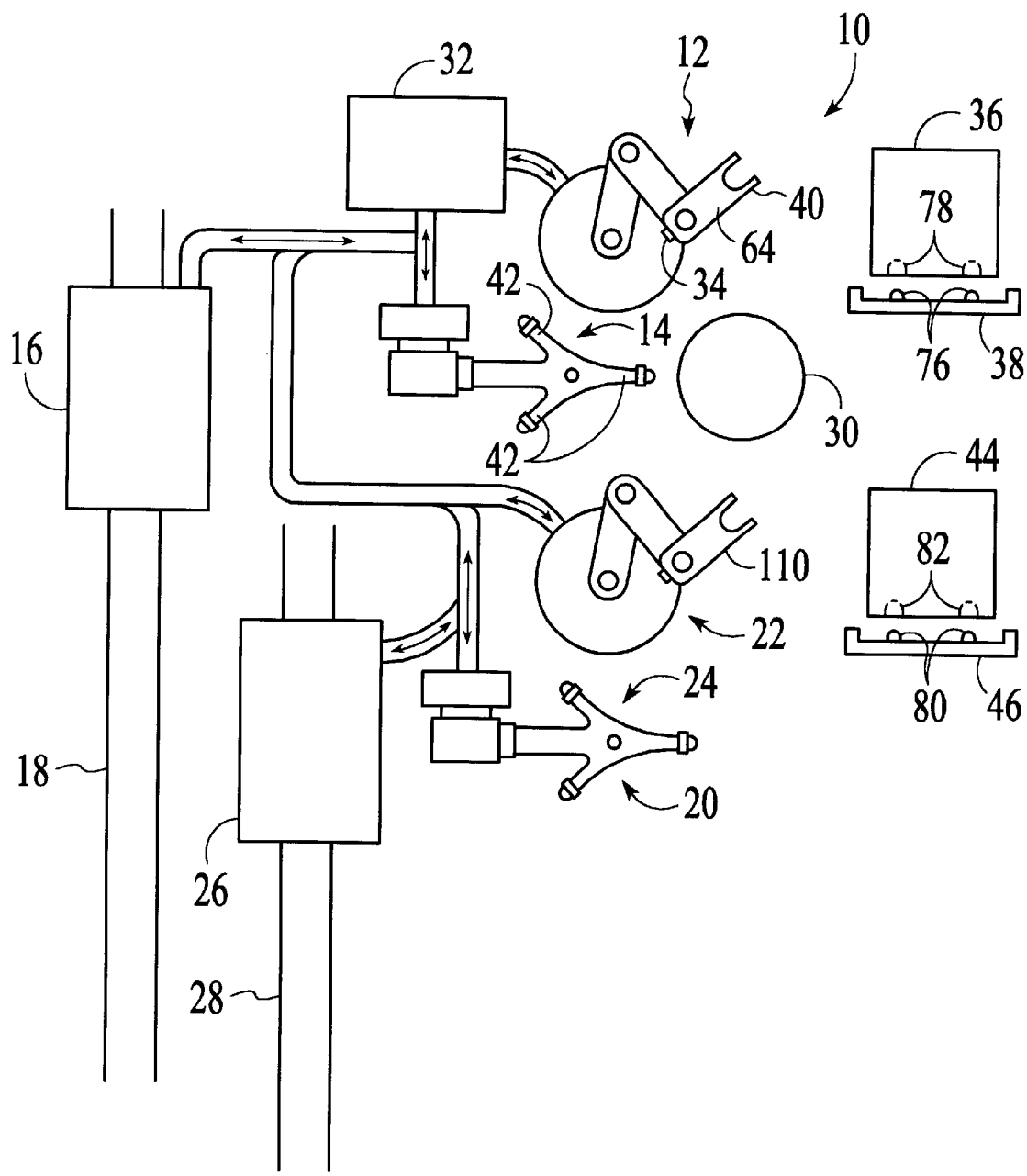
FIG. 1 illustrates the components of a preferred embodiment of the present invention.

FIG. 1 of the drawing illustrates the major components of a preferred embodiment of the wafer handling apparatus of the present invention. A wafer input system 10 includes an input robot 12, an input twist and rotate 14, and an input carrier 16 with an input rail 18 for transport of the carrier to a wafer processing area (not shown). Similarly, a wafer output system 20 includes an output robot 22, an output twist and rotate 24, an output carrier 26, and an output rail 28 for transporting the output carrier to a processing area (not shown). A filler storage item 30 is also shown for storage of filler wafers. The various robotic components are all directed by a programmed machine controller 32 that automatically directs a position detection, i.e. teaching/calibration operation and wafer loading and unloading operations. Further details of a controller and its operation with a robot, such as robot 12, and use of a laser emitter and detector system to detect position of an object are described in U.S. patent application Ser. No. 09/270,261 filed Mar. 15, 1999, the contents of which are incorporated herein by reference.

The automatic teaching/calibration operation is a novel feature of the present invention and will be fully described in the following text. After this operation is performed, the normal process of wafer loading involves the robot 12 using a laser emitter-detector 34 to sense any wafers on an input pod 36 positioned on an input pedestal 38. The controller records both empty and filled wafer slots/positions in the pod. The robot then proceeds to use a wand 40 to remove a wafer from the pod 36 and to place it on the twist and rotate 14, which at that time is oriented with the arms 42 in a horizontal plane. The twist and rotate grasps the wafer and then twists, placing the wafer in a vertical plane, and rotates to place the vertically oriented wafer on the carrier 16. This process is repeated until the pod 36 is empty or until the carrier 16 is full. In the event of an empty pod slot, the controller 32 can be programmed in one of three ways. It can extract a "filler" wafer from the filler storage area 30 to place in the carrier slot corresponding to the empty position in the pod, or it can be programmed to fill all carrier slots sequentially and record the wafer order noting the empty pod slot positions so that when the wafers are unloaded and placed on an output pod, they can be placed in the same order, including leaving empty slots where there were empty slots in the input pod. As a further alternative, the controller can simply leave an empty slot in the carrier in the corresponding position of an empty slot in the pod.

Wafer unloading proceeds in a similar manner to wafer loading. The arrival of a batch of wafers in the output carrier 26 on rail 28 can automatically trigger the unloading operation, or optionally a user prompt can be presented by the controller 32. The output robot first checks for the presence of an empty pod 44 on output pedestal 46. If an empty pod 44 is present, the unloading operation proceeds. The controller directs the twist and rotate 24 to pick up a wafer from carrier 26 and place it in the horizontal position for pick up by the output robot 22. The output robot then deposits the wafer in the pod 44. This process continues until the carrier is empty, or until the pod 44 is full. All filler wafers are placed back into the filler storage area 30.

Figure 2:
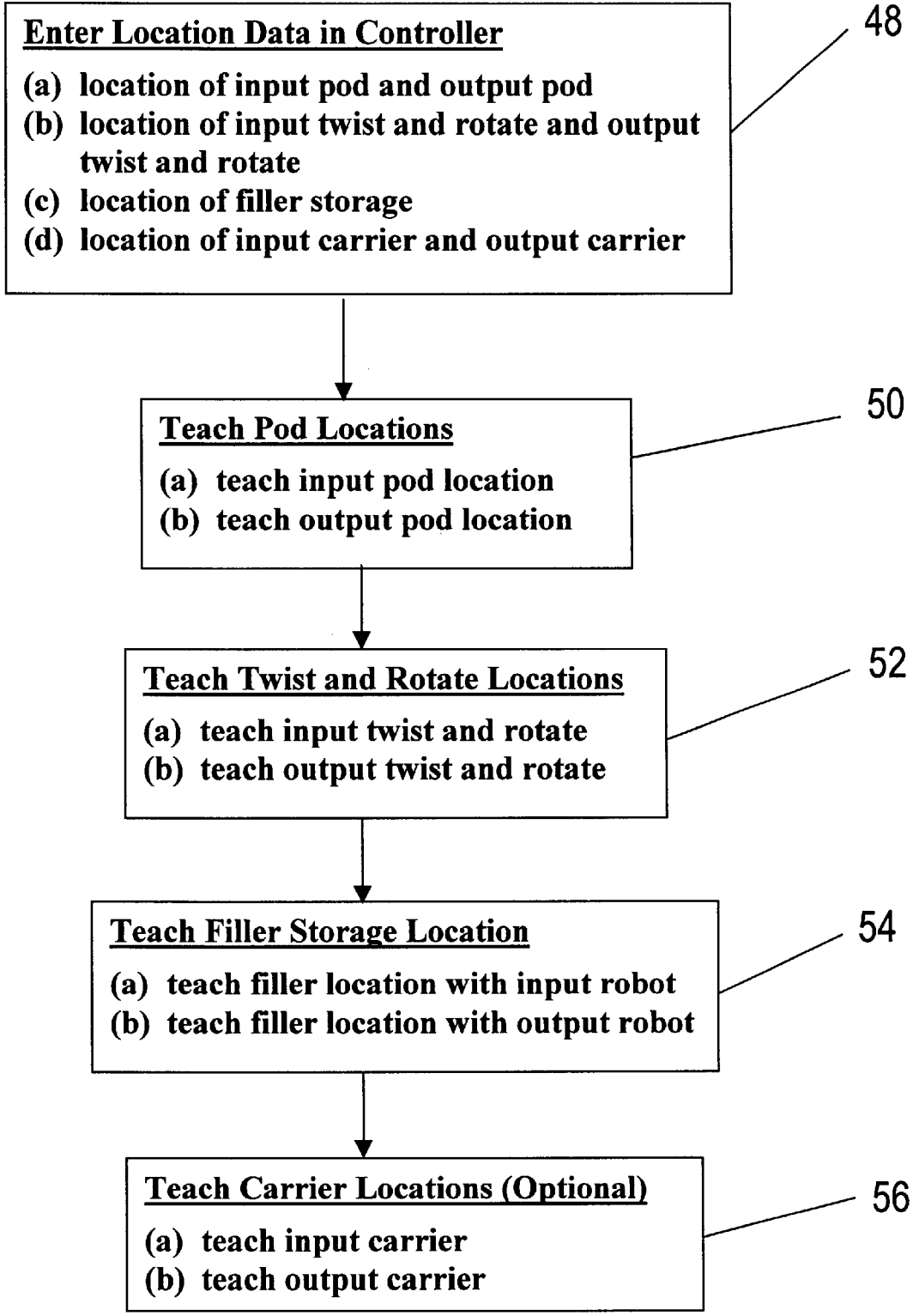
FIG. 2 is a flow chart summarizing the various teaching/calibration procedures of the robotic system of the present invention.

The processes of programming the controller 32 and gathering precision location data on the various components are summarized in FIG. 2. These processes will be referred to as teaching or calibrating the robotic system. Prior to actual use of the apparatus for handling wafers, the teaching/calibration procedures are performed. The controller 32 is first loaded with data containing approximate dimensions/locations of all of the necessary components (block 48). The approximate data is acquired from sources such as construction drawings. Due to normal tolerances, the dimensions from drawings are considered approximate, and more precise data is needed to assure safe transport of the wafers. The entry of approximate data 48 is a one time manual operation. The subsequent operations of blocks 50–56 are automated, the sequence being directed by the programmed controller 32. The input and output robots 12 and 22 are directed by the controller for collecting location data for the input and output pods 36 and 44 (block 50). The robots 12 and 22 perform teaching/calibration operations on the twist and rotates 14 and 24 (block 52), on the filler storage 30 (block 54), and optionally on the location of the input and output carriers 16 and 26 (block 56). These operations will be fully explained in reference to the following figures of the drawing.

Figure 3:
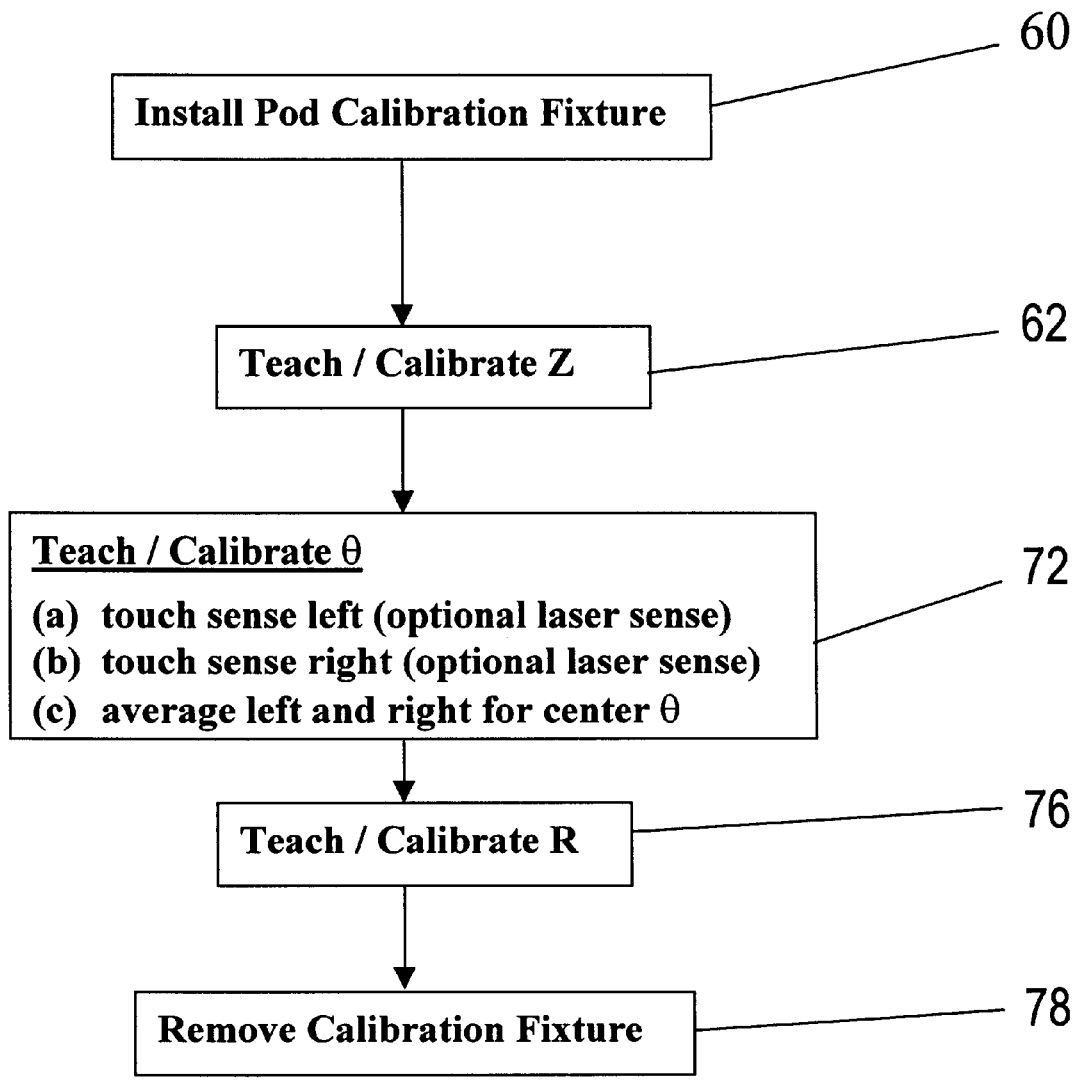
FIG. 3 is a more detailed flow chart of the teaching procedures for gathering the pod location data.
Figure 4A:
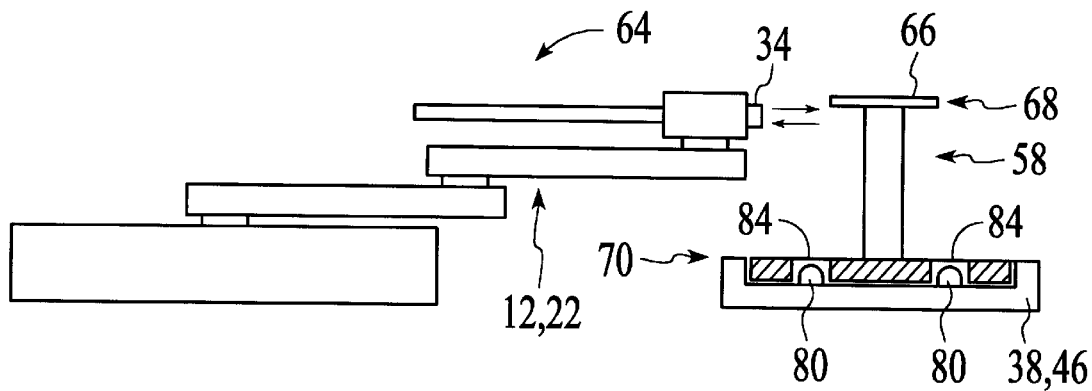
FIG. 4a illustrates the Z teaching/calibration using a pod fixture.
Figure 4B:
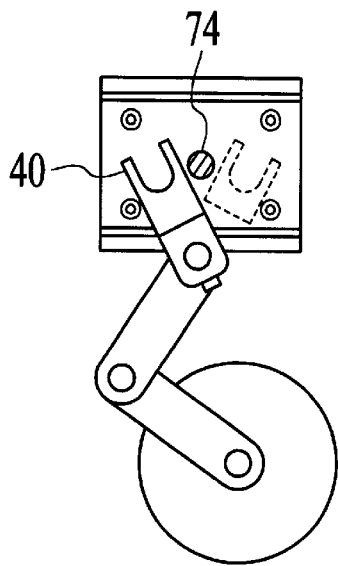
FIG. 4b illustrates gathering the θ position of a pod fixture.
Figure 4C:
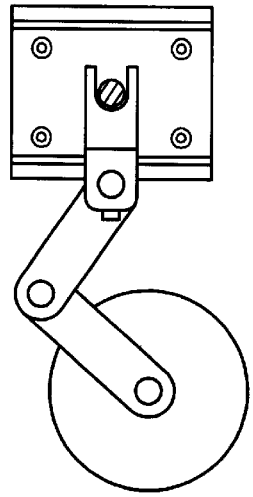
FIG. 4c illustrates the acquisition of R pod location data.

The automatic procedure of teaching the locations of the input and output pods is described in detail in reference to FIGS. 3 and 4a, b, c. The location of pods 36 and 44 is calibrated with the assistance of a precision fixture 58 that is placed on the pedestals 38 and 46. The controller uses the dimensional data acquired from the fixture 58 to determine the wafer positions in the pods 36 and 44. The installation of the fixture 58 is indicated in block 60 of FIG. 3 and shown in the drawing of FIG. 4a. The teaching/calibration of location coordinates for the pod and other components preferably uses the R, θ, Z coordinate system shown in FIG. 5 in reference to an X, Y, Z coordinate system. The robots 12 and 22 have a laser emitter-detector 34 on one end of the third arm 64 (FIG. 4a). FIG. 3 indicates the teaching/calibration of the Z dimension of the fixture (block 62), and this is illustrated in FIG. 4a. The controller 32 is programmed to initially refer to the preprogrammed location of the fixture head 66 and directs the emitter-detector 34 to within a safe distance. In the example of FIG. 4a, the edge 68 is used as the reference feature for Z calibration. The controller raises the emitter-detector 34 upwards until a signal is reflected off of the head 66, indicating that the edge 68 has been reached. The corresponding coordinate, or i.e. Z-coordinate motor position for this point is then stored in memory as a Z reference, thereby teaching/calibrating the Z position. The controller calculates the Z coordinates of the wafer positions in the pod using this Z reference data. Alternatively, the Z reference can be determined by sensing the level of an edge such as 70 (FIG. 4a) of the pedestal 38, 46. FIG. 4a shows the use of a laser to sense the Z reference. Alternatively, the controller can include programming to sense the motor current to touch sense the edge 68 or 70 as described in U.S. patent application Ser. No. 09/524,025, the entire content of which is incorporated herein by reference. In general, wherever touch sensing is described, an alternative design using a laser sensor (emitter-detector) will be understood and is also included in the spirit of the present invention, and where a laser is specified, a design using a touch sensor may also be applied, as will be understood by those skilled in the art. Details of teaching using laser sensing are included in U.S. Pat. Ser. No. 09/270,261, the entire contents of which are incorporated herein by reference. The particular selections of touch and laser sensing described herein are given as the preferred embodiment of the invention. The teaching/calibration of the angular θ dimension is indicated in block 72 of FIG. 3 and illustrated in a planar view in FIG. 4b. The controller 32 moves the wand 40 to a preprogrammed safe place on one side of the post 74, and then moves the wand around in the θ direction until it senses the wand touching the post. This first position is recorded in memory. The controller then repeats the procedure from the other side of the post. The two angular measurements are averaged to get the θ dimension for the pod center. FIG. 3 block 76 indicates collection of the R dimension reference. This is illustrated in FIG. 4c showing the wand 40 extended at the center θ angle until contact with the post is sensed and the corresponding R dimension data is recorded in controller memory. The fixture is then removed (lock 78). Note in FIGS. 1, 4a, 4b, 4c, the guide pins 80 for insertion in corresponding holes 82 in the pod (FIG. 1) and 84 in the fixture (FIG. 4c), assuring accurate, reproducible placement of the fixture 58, or pods 36 and 44. The controller then uses the reference R, θ, Z dimensions along with the known pod dimensions to calculate the pod wafer slot positions to safely direct the robot wand 40 to pick up wafers from a pod placed on a pedestal. To pick up a wafer, the controller directs the wand to a position between two wafer slots and then moves the wand up until the wafer is contacted and lifted a small amount by the wand. A suction is then applied through canals (not shown) in the wand to cause the wafer to "adhere" to the wand as the wafer is then removed from the pod.

Figure 5:
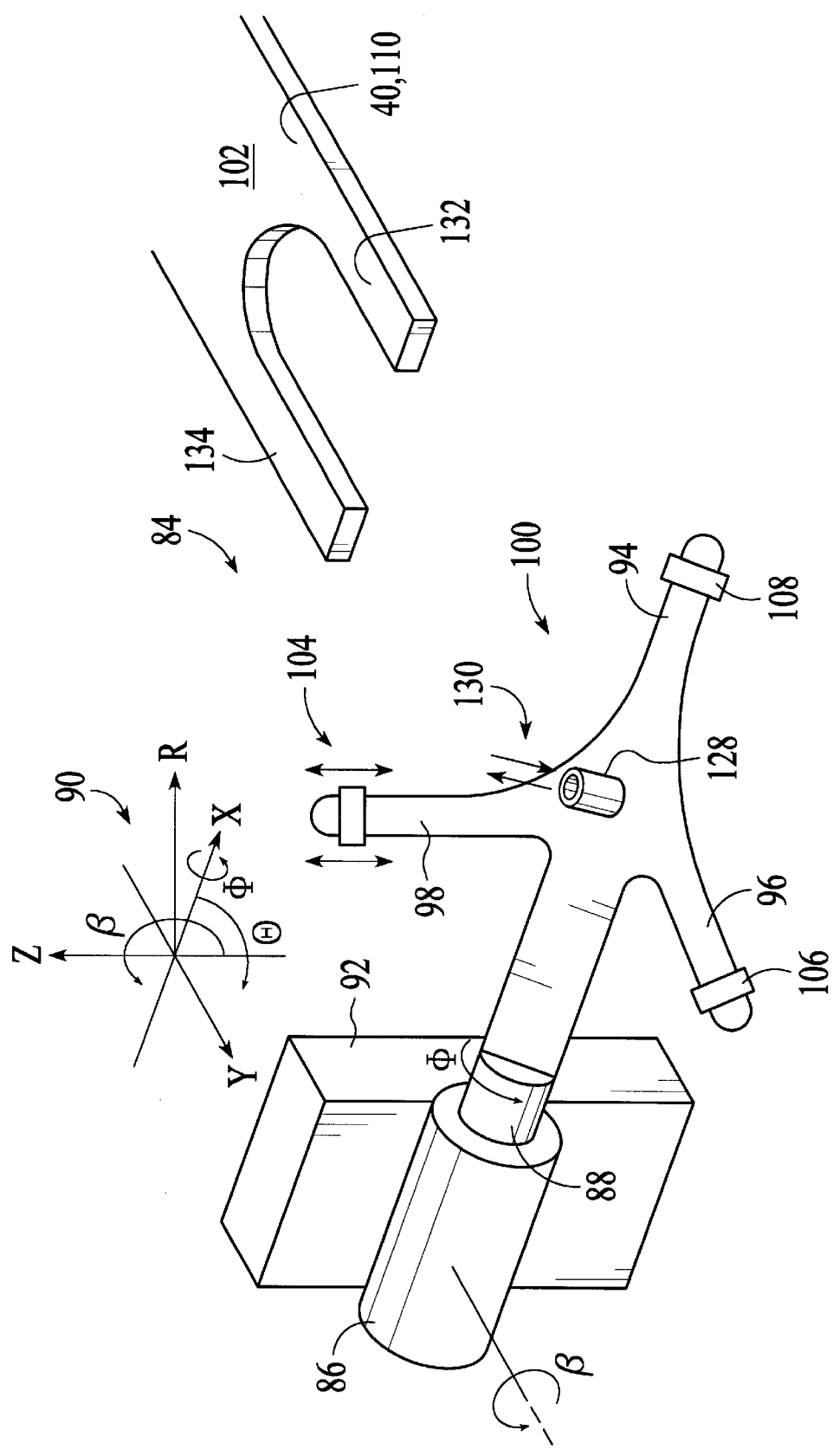
FIG. 5 is a perspective view of a twist and rotate and a wand for illustrating the calibration procedure.

The teaching and operation procedures of the twist and rotate components 14 and 24 are described in reference to the perspective drawing of FIG. 5. A twist and rotate 84, representing either of twist and rotate components 14 or 24 is shown to have a first motor assembly 86 for rotating a shaft 88 in the φ direction around the X axis as defined in the reference coordinate system 90, and a second motor assembly 92 for rotating the first motor assembly around the Y axis or i.e. in the beta direction in the X-Z plane.

In operation referring back to FIG. 1, for transfer of a wafer from input pod 36 to carrier 16, the robot 12 extracts a wafer from the pod 36, or a filler wafer from the storage 30 and the controller directs motors 86 and 92 to place arms 94, 96, 98 of wafer tool 100 in the X-Y plane, parallel to the plane of the wafer contact surface 102 of the wand 40. The robot 12 then places a wafer on the tool 100 and the controller directs the tool 100 to grip the wafer by actuating the movable grip 104, clamping the wafer against grips 106 and 108. In order to move a wafer to the carrier 16 (FIG. 1), the motor 86 rotates the tool into the vertical X-Z plane perpendicular to horizontal plane X-Y. The motor 92 then rotates the motor 86 with the tool 100 to the carrier 16, and the tool releases the wafer into a carrier slot. For unloading wafers from the carrier 26 to the output pod 44, the motor 86 (now referring to the twist and rotate 24 of FIG. 1) places the tool 100 in the X-Z plane, and motor 92 rotates it to the carrier 26, which previously was placed in a position to receive the tool 100 adjacent a wafer. The controller then moves the carrier to place a wafer against the arms 94–98, and the wafer is gripped by activating a moveable grip 104, clamping the wafer against grips 106 and 108. The controller then activates motor 92 to rotate the motor 86 with tool 100 back adjacent the robot 22 (FIG. 1) and directs motor 86 to rotate the tool into the X-Y horizontal plane for wafer pickup by the robot 22 (FIG. 1). The robot 22 then picks the wafer from the tool 100 with wand 110 (FIG. 1) and places it in the appropriate wafer slot in pod 44 as directed by the controller 32. Any filler wafers are placed in the filler storage 30.

In describing the teaching/calibrating of the twist and rotates 14 and 24, reference is made again to FIG. 5 with the twist and rotate indicated as item 84 representative of either of twist and rotate components 14 and 24, and the wand representative of the wands 40 and 110 of either robot 12 or 22. The calibration begins with the controller directing the motors 92 and 86 to place the wafer handler 100 in the X-Y plane and adjacent to the robot (12 or 22), for example, as twist and rotate 14 is shown in FIG. 1, and as approximately shown in FIG. 5. This positioning is directed by the controller according to the pre-programmed data stored in the controller's memory and is an approximate position. The controller then directs the robot to sense the arms 98 and 94 to determine their vertical (Z) position. The sensor signals are compared by the controller and if they are not the same i.e. if the two arms are not the same height (Z dimension), the controller directs the motors 86 and 92 to rotate to correct the difference, to put the two arms in the same plane. The controller then directs the robot to sense the heights of the two arms again, and the correction process is repeated until the two arms are the same height within an allowed tolerance. The controller stores the data corresponding to this position and uses it to place the handler 100 correctly during the actual wafer handling operations. FIG. 5 shows a wand 40 or 110 for use in touch sensing to detect the position of arms 94 and 98. Alternatively, the laser emitter-detector 34 can be used to sense the height of the arms 94 and 98. The height sensing is done in a similar manner to that explained in reference to FIG. 4a for measuring the height of a pod fixture.

The process of teaching/calibration of a twist and rotate is illustrated in the flow chart of FIG. 6. The process begins in block 114 with the controller directing the twist and rotate to its approximate horizontal position adjacent to the robot. The robot then senses one arm (block 116) and then another arm (block 118). The Z dimensions of the two arms are compared (block 120). If the heights are not the same within the allowed tolerance 122, the controller makes an adjustment (124) and the arms are sensed again (steps 116–120). The loop 116–124 is repeated until the arms are positioned within the allowed tolerance. If the heights are the same, within the required tolerance 126, the calibration/teaching continues to determine the R and θ positions of the twist and rotate. A preferred method of sensing the R and θ is through use of a laser emitter detector 128 (FIG. 5) positioned at the center of the handler 100 to detect if the wafer is in place. In order to detect the θ center of the handler 100, the controller 32 directs the wand 40, 110 over the handler 100 with laser beam 130 between the prongs 132, 134. The controller then moves the wand in the θ direction until one of the prongs reflects the laser beam, and this position is recorded (block 136). The wand is then moved back in the θ direction until the other prong reflects the beam 130 (block 138). The controller then averages the two position data to arrive at the data for the center of handler 100 (block 140). The controller then places the wand at the angular center θ and moves it towards the beam until the beam is reflected. This gives data to the controller of the radial R location of the handler 100 (block 142). An accurate height data for the handler is obtained by sensing the handler, such as an edge of an arm 94 or 98, either by touch sensing or with a laser emitter-detector, such as 34 on the robot 12 of FIG. 1 (block 144). The operation is similar to that described in reference to FIG. 4a for sensing the height of the head 66.

FIG. 7 is a more detailed view of the filler storage container 30 for illustrating teaching its location. The process is similar to that used for the other components. The controller directs a robot to extend a wand, such as wand 40 of robot 12 or wand 110 of robot 22 (FIG. 1) close to a corner 146, for example, and then brings the wand into contact with the corner 146 and records the position data. This is illustrated as block 148 in FIG. 8. The robot then puts the wand in a symmetrically opposite position 150 and senses the corner 152 (block 154 in FIG. 8). The data for the two θ positions is averaged by the controller to calculate the center θ position (block 156, FIG. 8). The wand is then moved to position 158 to sense the radial R position (block 160), and the wand is moved to a position such as at 162, to sense a feature of the container 30 (block 164) that will serve as a Z reference. The controller uses this data as an accurate reference for use in finding the position of the wafer slots 166.

FIG. 9 illustrates a method of calibration/teaching the controller where to put the wafer carriers 16, 26 (FIG. 1). The number 168 is assigned to the carrier in FIG. 9 and 170 to the rail, but represents operation of either carrier 16 or 26 and corresponding rails 18 and 28 of FIG. 1. Similarly, the representative numbering of FIG. 5 for the twist and rotate will be continued in FIG. 9.

The carrier 168 is propelled by a driven rail apparatus 170. FIG. 9 shows a plurality of wafer receiving slots 172. The carrier 168 also has a laser emitter-detector 174 for sensing the position of the wafer handler 100. Calibration/teaching of the position of the handler 100 proceeds as follows. The controller first assures that the handler is in position over the carrier as shown in FIG. 9. If the carrier is outside the vicinity of the twist and rotate, the controller must first direct the twist and rotate to rotate the handler in the X-Z plane (FIG. 5) and out of the path of the carrier. The controller then brings the carrier into the position approximately as shown in FIG. 9, after which the twist and rotate is directed to place the handler as shown over the carrier between wafer slots. The controller then moves the carrier to bring a beam from the emitter-detector 174 to the point of reflection from the wafer handler 100. The controller records the position data corresponding to this location. With accurate dimensional data of the carrier slots 172 relative to the beam pre-programmed, the controller then uses acquired position data to calculate the position of each slot 172, for setting a slot in line with the handler to receive a wafer as required.

An additional laser-emitter detector 176 is shown in FIG. 9 that is used to detect the presence and location of any wafers on the carrier as the carrier is moved past the emitter-detector. If wafers are present, a warning notice is given. As an alternate to precision calibrating the position of a carrier, the rail and carrier apparatus may be dimensioned accurately enough so that precision calibrating of this data is not necessary.

A typical loading operation subsequent to the teaching/calibration operations is illustrated in reference to FIGS. 1 and 10. A pod 36 with wafers is installed (block 178) on the pedestal 38 (FIG. 1). The controller is activated and proceeds to check if a carrier is in position (block 180). If so (186), the emitter-detector 176 checks for wafers (block 181). If wafers are present (183) a notice is given 185. If no carrier is in position (182), a carrier is moved into position and a check for wafers is done (184). If an empty carrier is in position (189, 191) the controller proceeds to direct the operation as follows. Robot 12 checks for wafers in the pod 36 and the locations are recorded by the controller (block 188). The twist and rotate moves into the receiving position with the wafer handler in a horizontal position (block 190). The robot then removes a wafer from the pod (block 192) and places it on the twist and rotate (block 194). The twist and rotate twists the handler 90 degrees and rotates it over to the carrier and sets it over a carrier slot and releases the wafer (block 196). If the slot in the pod was empty, the controller can be programmed to either leave a corresponding empty slot in the carrier, or a filler wafer can be taken from the filler storage 30 and placed in the empty slot. As a further alternative, the controller can be programmed to leave no empty slots in the carrier. In this case, the controller keeps a record of the wafers in the carrier relative to their positions in the pod so they can be loaded into the output pod in the same order as received, including leaving empty slots where they were originally empty. The controller checks its data to determine if another wafer is in the pod (block 198). If so (200), the steps of 190–198 are repeated, loading another wafer from the pod to the carrier. If no more wafers are in the pod (202), the controller activates the rail to deliver the carrier to the processing area, or wait for a command to do so (block 204).

FIG. 11 illustrates the unloading operation, wherein wafers are removed from carrier 26 and loaded into pod 44 (FIG. 1). As described above, the controller has record of the wafers on the carrier, including their position on the carrier and the position on the pod from which they were unloaded. An output pod 44 is installed on the output pedestal 46 (block 205). The controller 32 proceeds to direct the twist and rotate 24 to remove a wafer from the carrier 26 (block 206). The output robot 22 takes the wafer from the twist and rotate 24 (block 208). The controller determines if the wafer is a filler wafer or not (block 210). If the wafer is a filler wafer 212, the robot places the wafer in the filler storage 30 (block 213). If the wafer is a "real" wafer 214, it is placed on the pod 44 at the location corresponding to the location from which it was removed (block 216). Decision block 218 specifies that if there are more wafers 220, the steps of 206 to 218 are repeated and if there are no more wafers (222) in the carrier 26, the pod can be removed (block 224).

FIG. 12 illustrates the input robot 12 sensing wafers 226 in the input pod 36. The laser emitter detector 34 is preferably used to sense if a wafer is in each slot 228 and also records its precise Z-coordinate position. The controller 32 keeps a record of the wafers, including their position on the incoming pod. If a slot in the pod 36 is empty, the controller has three options. It can leave a corresponding slot in the carrier empty, or it can fill the carrier slot with a filler wafer from the filler storage area. As a further alternative, the controller can stack the wafers in the carrier without leaving empty slots, and instead store the information regarding the empty pod slots in memory. When the output robot 22 loads the wafers into the output pod, the controller causes them to be loaded in the slots corresponding to the order they were taken from the input pod, leaving an empty slot where one existed originally.

Although the present invention has been described above in terms of a specific embodiment, it is anticipated that alternations and modifications thereof will no doubt become apparent to those skilled in the art. It is therefore intended that the following claims be interpreted as covering all such alterations and modifications as fall within the true spirit and scope of the invention.

It is claimed that:

1. An apparatus for wafer handling comprising:
   (a) a carrier apparatus for conveying wafers in a wafer processing system;
   (b) wafer transfer apparatus for transferring wafers to and from said carrier apparatus and to and from a wafer pod apparatus, said wafer transfer apparatus including
      (i) first position sensing apparatus for sensing a position of a robotic component of said wafer transfer apparatus;
      (ii) second position sensing apparatus for detecting a location of an object;
   (c) a controller apparatus for directing operation of said apparatus for wafer handling, said controller apparatus including
      (i) first data storage apparatus containing approximate dimensions of said wafer handling apparatus for use in directing said carrier apparatus and said wafer transfer apparatus;
      (ii) teaching apparatus responsive to a signal from said first position sensing apparatus and said second position sensing apparatus for collecting precision location data for precision positioning of said wafer transfer apparatus; and
      (iii) control apparatus programmed for automatically directing said teaching apparatus and for using said first data storage apparatus and said precision data to direct said wafer transfer apparatus and said carrier apparatus to transfer wafers.

2. An apparatus as recited in claim 1 wherein said wafer pod apparatus includes an input pod, and said wafer transfer apparatus includes an input wafer transfer apparatus for transferring wafers from said input pod to said carrier apparatus.

3. An apparatus as recited in claim 2 wherein said wafer pod apparatus includes an output pod, and said wafer transfer apparatus further includes an output wafer transfer apparatus for transferring wafers from said carrier apparatus to said output pod.

4. An apparatus as recited in claim 3 wherein said carrier apparatus includes:
   (a) an input carrier apparatus for receiving wafers from said input wafer transfer apparatus; and
   (b) an output carrier apparatus for delivering wafers to said output wafer transfer apparatus.

5. An apparatus as recited in claim 1 wherein said wafer transfer apparatus includes:
   (a) a twist and rotate apparatus for transferring wafers to and from said carrier apparatus; and
   (b) a robot for transferring wafers between said wafer pod apparatus and said twist and rotate apparatus.

6. An apparatus as recited in claim 4 wherein
   (a) said input wafer transfer apparatus includes
      (i) an input twist and rotate for transfer of wafers to said input carrier apparatus; and
      (ii) an input robot for transferring wafers from said input pod to said input twist and rotate; and
   (b) said output wafer transfer apparatus includes
      (i) an output twist and rotate for transfer of wafers from said output carrier apparatus; and
      (ii) an output robot for transfer of wafers from said output twist and rotate to said output pod.

7. An apparatus as recited in claim 6 wherein
   (a) said input robot includes an articulated cantilevered arm; and
   (b) said output robot includes an articulated cantilevered arm.

8. An apparatus as recited in claim 5 wherein said robot includes an articulated cantilevered arm.

9. An apparatus as recited in claim 8 wherein said second sensing apparatus is a laser emitter-detector.

10. An apparatus as recited in claim 8 wherein said robot includes a servo motor, and said second sensing apparatus includes torque sensing apparatus for sensing an increase in torque applied to move said arm when said arm touches said object.

11. An apparatus as recited in claim 10 wherein said second sensing apparatus further includes a laser emitter-detector included with said arm.

12. An apparatus as recited in claim 7 wherein said second sensing apparatus includes
   (a) an input robot laser emitter-detector included with said input arm; and
   (b) an output robot laser emitter-detector included with said output arm.

13. An apparatus as recited in claim 7 wherein
   (a) said input robot includes a servo motor;
   (b) said output robot includes a servo motor; and
   (c) said second sensing apparatus includes a torque sensing apparatus for sensing an increase in torque applied to move said input robot arm, and for sensing an increase in torque applied to move said output robot arm for sensing when said input robot arm contacts an object and when said output robot arm makes contact with an object.

14. An apparatus as recited in claim 13 wherein said controller apparatus is programmed to automatically direct operations of said apparatus for wafer handling, said operations including
   (a) directing said teaching apparatus to acquire said precision data, said directing including
      (i) acquiring position data of said input pod and said output pod;
      (ii) leveling a plurality of wafer handler arms on said input twist and rotate and said output twist and rotate; and
      (iii) acquiring position data of said input twist and rotate and said output twist and rotate.

15. An apparatus as recited in claim 14 wherein said operations further include
   (a) sensing wafers on said input pod and recording position data of said wafers in said input pod;
   (b) extracting a said wafer from said input pod using said input robot;
   (c) transferring said wafer from said input robot to said input twist and rotate;
   (d) transferring said wafer from said input twist and rotate to said input carrier; and
   (e) repeating steps b, c, and d until all wafers in said input pod are transferred to said input wafer carrier.

16. An apparatus as recited in claim 14 wherein said operations further include
   (a) extracting a wafer from said output carrier using said output twist and rotate;
   (b) transferring said wafer from said output twist and rotate to said output robot; and
   (c) placing said wafer from said output robot into said output pod in a location corresponding to said wafer position in said input pod from which said wafer was removed.

* * * * *